United States Patent
Song et al.

(10) Patent No.: US 12,135,486 B2
(45) Date of Patent: Nov. 5, 2024

(54) DRIVING SUBSTRATE, DISPLAY PANEL, AND MANUFACTURING METHOD OF DRIVING SUBSTRATE

(71) Applicant: Wuhan China Star Optoelectronics Technology Co., Ltd., Hubei (CN)

(72) Inventors: Jiyue Song, Hubei (CN); Fei Ai, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/289,764

(22) PCT Filed: Mar. 17, 2021

(86) PCT No.: PCT/CN2021/081364
§ 371 (c)(1),
(2) Date: Nov. 29, 2023

(87) PCT Pub. No.: WO2022/188198
PCT Pub. Date: Sep. 15, 2022

(65) Prior Publication Data
US 2024/0077776 A1    Mar. 7, 2024

(30) Foreign Application Priority Data
Mar. 8, 2021 (CN) .......................... 202110249764.4

(51) Int. Cl.
*G02F 1/1368* (2006.01)
*G02F 1/1362* (2006.01)
*H01L 27/12* (2006.01)

(52) U.S. Cl.
CPC ...... *G02F 1/1368* (2013.01); *G02F 1/136209* (2013.01); *G02F 1/136222* (2021.01); *H01L 27/124* (2013.01); *H01L 27/1288* (2013.01)

(58) Field of Classification Search
CPC ............. G02F 1/1368; G02F 1/136209; G02F 1/136222; H01L 27/124; H01L 27/1288
See application file for complete search history.

(56) References Cited

U.S. PATENT DOCUMENTS

| | | | |
|---|---|---|---|
| 2020/0212137 A1* | 7/2020 | Wang | H10K 59/1213 |
| 2021/0134896 A1* | 5/2021 | Guo | G06V 40/1318 |
| 2022/0005888 A1* | 1/2022 | Wang | H10K 59/12 |

(Continued)

FOREIGN PATENT DOCUMENTS

| | | |
|---|---|---|
| CN | 103681701 | 3/2014 |
| CN | 105977314 | 9/2016 |
| CN | 107480639 | 12/2017 |

(Continued)

*Primary Examiner* — James A Dudek

(57) ABSTRACT

Embodiments of the present disclosure disclose a driving substrate, a display panel, and a manufacturing method of the driving substrate. In the driving substrate, a first electrode is connected to a first thin film transistor; a photosensitive diode includes a first semiconductor layer and an intrinsic semiconductor layer sequentially disposed on the first electrode, the intrinsic semiconductor layer wraps the first semiconductor layer and the first electrode; and a second conductive layer is disposed on the photosensitive diode. The second conductive layer includes a second electrode, and the second electrode covers the photosensitive diode.

18 Claims, 6 Drawing Sheets

(56) References Cited

U.S. PATENT DOCUMENTS

2022/0246695 A1\* 8/2022 Liu .................. H10K 59/65

FOREIGN PATENT DOCUMENTS

| CN | 109300919 | 2/2019 |
| CN | 110088909 | 8/2019 |
| CN | 111781777 | 10/2020 |
| CN | 112198729 | 1/2021 |
| JP | 07-193249 | 7/1995 |
| JP | 2009-130084 | 6/2009 |

\* cited by examiner

DRIVING SUBSTRATE, DISPLAY PANEL, AND MANUFACTURING METHOD OF DRIVING SUBSTRATE

FIELD OF INVENTION

The present disclosure relates to the field of display technology, specifically to a driving substrate, a display panel, and a manufacturing method of the driving substrate.

BACKGROUND OF INVENTION

An optical fingerprint recognition technology is a technology that uses principles of light refraction and reflection. For example, when light is irradiated on a finger, the light is reflected by the finger to a photosensitive device. Due to different reflection effects of fingerprint valleys and fingerprint ridges, intensities of reflected lights from the fingerprint valleys and the fingerprint ridges received by the photosensitive device are different, and then the photosensitive device converts optical signals into electrical signals, thereby performing fingerprint recognition. The optical fingerprint recognition technology has good stability, strong penetrating ability, and relatively low cost.

However, while researching and practicing prior art, the inventor of the present disclosure found that current mobile phones or tablets equipped with optical fingerprint recognition function are all self-luminous organic light-emitting diode display screens and liquid crystal photosensitive display screens.

Please refer to FIG. 1, in a driving substrate of the prior art, the driving substrate may be a driving substrate of a liquid crystal display panel or a backplate of an organic light-emitting diode panel. The driving substrate comprises a thin film transistor structure layer TFT and a lower electrode S1, a first insulating layer S2, an N-type layer S3, an I-type layer S4, a P-type layer S5, a second insulating layer S6, and an upper electrode S7 disposed on the thin film transistor structure layer TFT sequentially. It can be seen that an optical fingerprint recognition unit in the prior art is integrated with more film layers, which has a more complicated structure and a higher difficulty of integration.

SUMMARY

Technical Problem

Embodiments of the present disclosure provide a driving substrate, a display panel, and a manufacturing method of a driving substrate, which can simplify an integrated structure of the optical fingerprint recognition unit and reduce difficulty of integration process.

Solution to Technical Problem

Technical Solution

An embodiment of the present disclosure provides a driving substrate, comprising:
a substrate;
a thin film transistor structure layer disposed on the substrate, wherein the thin film transistor structure layer comprises a first thin film transistor;
a first conductive layer disposed on the thin film transistor structure layer, wherein the first conductive layer comprises a first electrode, and the first electrode is connected to the first thin film transistor;
a photosensitive diode disposed on the first electrode, wherein the photosensitive diode comprises a first semiconductor layer and an intrinsic semiconductor layer sequentially disposed on the first electrode, and the intrinsic semiconductor layer wraps the first semiconductor layer and the first electrode; and
a second conductive layer disposed on the photosensitive diode, wherein the second conductive layer comprises a second electrode, and the second electrode covers the photosensitive diode.

Alternatively, in some embodiments of the present disclosure, the photosensitive diode further comprises a second semiconductor layer disposed on the intrinsic semiconductor layer, the second semiconductor layer wraps the intrinsic semiconductor layer, and the second electrode is connected to the second semiconductor layer.

Alternatively, in some embodiments of the present disclosure, the photosensitive diode further comprises a second semiconductor layer disposed on the intrinsic semiconductor layer, the second semiconductor layer covers the intrinsic semiconductor layer, and the second electrode is connected to the second semiconductor layer and the intrinsic semiconductor layer.

4. The driving substrate of claim 1, wherein, in an extending direction of the second electrode, the second electrode comprises a first portion, a second portion, and a third portion that are sequentially connected, the first portion and the third portion are disposed outside the second semiconductor layer, and the second portion and the second semiconductor layer are overlapped.

Alternatively, in some embodiments of the present disclosure, the second conductive layer further comprises a common electrode, and the common electrode is connected to the second electrode.

Alternatively, in some embodiments of the present disclosure, the common electrode is multiplexed as a touch electrode.

Alternatively, in some embodiments of the present disclosure, the thin film transistor structure layer comprises a buffer layer, an active layer, an insulating layer, a first metal layer, an interlayer dielectric layer, a second metal layer, and a planarization layer which are sequentially disposed on the substrate;

the first metal layer comprises a first gate, and the active layer comprises a first active portion, and the second metal layer comprises a first source, a first drain, and a common wire; and the first gate, the first active portion, the first source, and the first drain form the first thin film transistor; the first source or the first drain is electrically connected to the first electrode, and the common wire is connected to the second electrode and the common electrode.

Alternatively, in some embodiments of the present disclosure, the thin film transistor structure layer further comprises a light shielding layer disposed between the substrate and the buffer layer, the light shielding layer is overlapped with the first active portion, and also overlapped with the photosensitive diode.

Alternatively, in some embodiments of the present disclosure, the driving substrate further comprises an insulating layer and a third conductive layer sequentially disposed on the second conductive layer, and the third conductive layer comprises a pixel electrode;

the first metal layer further comprises a second gate, the active layer comprises a second active portion, and the second metal layer comprises a second source and a second drain; wherein the second gate, the second active portion, the second source, and the second drain form a second thin film transistor; and the second source electrode or the second drain electrode is electrically connected to the pixel electrode.

Correspondingly, an embodiment of the present disclosure further provides a display panel, wherein the display panel comprises a color film substrate, a driving substrate, and liquid crystal disposed between the color film substrate and the driving substrate.

For example, the driving substrate comprises:
a substrate;
a thin film transistor structure layer disposed on the substrate, wherein the thin film transistor structure layer comprises a first thin film transistor;
a first conductive layer disposed on the thin film transistor structure layer, wherein the first conductive layer comprises a first electrode, and the first electrode is connected to the first thin film transistor;
a photosensitive diode disposed on the first electrode, wherein the photosensitive diode comprises a first semiconductor layer and an intrinsic semiconductor layer sequentially disposed on the first electrode, and the intrinsic semiconductor layer wraps the first semiconductor layer and the first electrode; and
a second conductive layer disposed on the photosensitive diode, wherein the second conductive layer comprises a second electrode, and the second electrode covers the photosensitive diode.

Alternatively, in some embodiments of the present disclosure, the photosensitive diode further comprises a second semiconductor layer disposed on the intrinsic semiconductor layer, the second semiconductor layer wraps the intrinsic semiconductor layer, and the second electrode is connected to the second semiconductor layer.

Alternatively, in some embodiments of the present disclosure, the photosensitive diode further comprises a second semiconductor layer disposed on the intrinsic semiconductor layer, the second semiconductor layer covers the intrinsic semiconductor layer, and the second electrode is connected to the second semiconductor layer and the intrinsic semiconductor layer.

Alternatively, in some embodiments of the present disclosure, in an extending direction of the second electrode, the second electrode comprises a first portion, a second portion, and a third portion that are sequentially connected, the first portion and the third portion are disposed outside the second semiconductor layer, and the second portion and the second semiconductor layer are overlapped.

Alternatively, in some embodiments of the present disclosure, a boundary of the second portion is disposed within an outer contour line of the second semiconductor, in a direction perpendicular to the extending direction of the second electrode.

Correspondingly, an embodiment of the present disclosure further provides a display panel, wherein the display panel comprises an organic light-emitting element layer and the above driving substrate, and the organic light-emitting element layer is disposed on the driving substrate.

For example, the driving substrate comprises:
a substrate;
a thin film transistor structure layer disposed on the substrate, wherein the thin film transistor structure layer comprises a first thin film transistor;
a first conductive layer disposed on the thin film transistor structure layer, wherein the first conductive layer comprises a first electrode, and the first electrode is connected to the first thin film transistor;

a photosensitive diode disposed on the first electrode, wherein the photosensitive diode comprises a first semiconductor layer and an intrinsic semiconductor layer sequentially disposed on the first electrode, and the intrinsic semiconductor layer wraps the first semiconductor layer and the first electrode; and a second conductive layer disposed on the photosensitive diode, wherein the second conductive layer comprises a second electrode, and the second electrode covers the photosensitive diode.

Alternatively, in some embodiments of the present disclosure, the photosensitive diode further comprises a second semiconductor layer disposed on the intrinsic semiconductor layer, the second semiconductor layer wraps the intrinsic semiconductor layer, and the second electrode is connected to the second semiconductor layer.

Alternatively, in some embodiments of the present disclosure, the photosensitive diode further comprises a second semiconductor layer disposed on the intrinsic semiconductor layer, the second semiconductor layer covers the intrinsic semiconductor layer, and the second electrode is connected to the second semiconductor layer and the intrinsic semiconductor layer.

Correspondingly, an embodiment of the present disclosure further provides a manufacturing method of a driving substrate, wherein the manufacturing method comprises the following steps:

Step B1: forming a thin film transistor structure layer on a substrate, wherein the thin film transistor structure layer comprises a first thin film transistor;

Step B2: forming a first conductive layer and a photosensitive diode on the thin film transistor structure layer, wherein the photosensitive diode is formed on the first conductive layer, the first conductive layer comprises a first electrode, and the first electrode is connected to the first thin film transistor; the photosensitive diode comprises a first semiconductor layer and an intrinsic semiconductor layer sequentially disposed on the first electrode, and the intrinsic semiconductor layer wraps the first semiconductor layer and the first electrode; and Step B3: forming a second conductive layer on the photosensitive diode, wherein the second conductive layer comprises a second electrode, and the second electrode covers the photosensitive diode.

Alternatively, in some embodiments of the present disclosure, the step B2 comprises the following steps:
forming a first conductive material layer and a first semiconductor material layer on the thin film transistor structure layer sequentially;
patterning the first conductive material layer and the first semiconductor material layer with a same photomask to form the first conductive layer and the first semiconductor layer;
forming the intrinsic semiconductor layer on the first semiconductor layer, wherein the intrinsic semiconductor layer wraps the first semiconductor layer; and
forming the second semiconductor layer on the intrinsic semiconductor layer, wherein the second semiconductor layer wraps the intrinsic semiconductor layer.

Alternatively, in some embodiments of the present disclosure, the step B2 comprises the following steps:
forming a first conductive material layer and a first semiconductor material layer on the thin film transistor structure layer sequentially;

patterning the first conductive material layer and the first semiconductor material layer with a same photomask to form the first conductive layer and the first semiconductor layer;

forming an intrinsic semiconductor material layer and a second semiconductor material layer on the first semiconductor layer sequentially; and patterning the intrinsic semiconductor material layer and the second semiconductor material layer with a same photomask to form the intrinsic semiconductor layer and the second semiconductor layer.

Alternatively, in some embodiments of the present disclosure, the second conductive layer further comprises a common electrode, and the common electrode is connected to the second electrode.

Alternatively, in some embodiments of the present disclosure, the step B1 comprises the following steps:

forming the light shielding layer on the substrate;

forming the buffer layer and the active layer on the light shielding layer in sequence, wherein the active layer comprises the first active portion, and the first active portion and the light shielding layer are overlapped;

forming the insulating layer and the first metal layer sequentially on the active layer, wherein the first metal layer comprises a first gate;

forming the interlayer dielectric layer on the first metal layer;

forming the second metal layer on the interlayer dielectric layer 126, wherein the second metal layer comprises the first source, the first drain and the common wire, and the first active portion, the first gate, the first source, and the first drain form the first thin film transistor; the first source or the first drain is electrically connected to the first electrode, the common wire is connected to the second electrode and the common electrode;

forming the planarization layer on the second metal layer.

Advantages of Invention

Beneficial Effect

The embodiments of the present disclosure save the first insulating layer and the second insulating layer in the prior art, thereby simplifying a structure of the driving substrate, and reducing process difficulty of the manufacturing method of the driving substrate.

BRIEF DESCRIPTION OF DRAWINGS

Description of Drawings

In order to more clearly explain the technical solutions in the embodiments of the present disclosure, the following will briefly introduce the drawings required in the description of the embodiments. Obviously, the drawings in the following description are only some embodiments of the present disclosure. For those skilled in the art, without paying any creative work, other drawings can be obtained based on these drawings.

Figure 1:
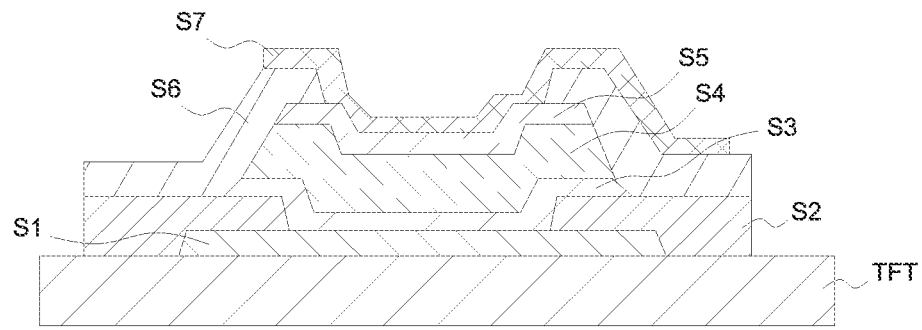

FIG. 1 is a schematic structural diagram of a driving substrate in prior art.

Figure 2:
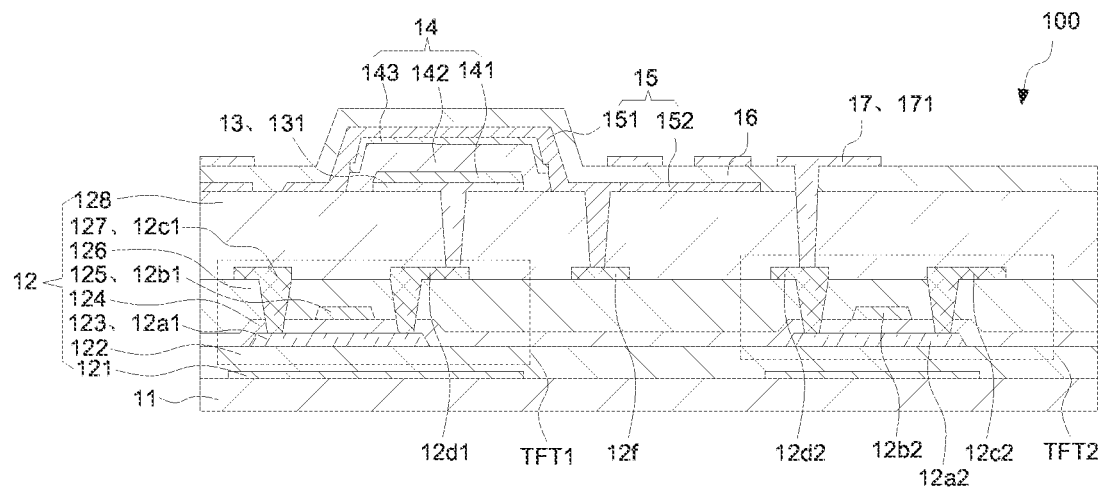

FIG. 2 is a schematic structural diagram of a driving substrate provided by a first embodiment of the present disclosure.

Figure 3:
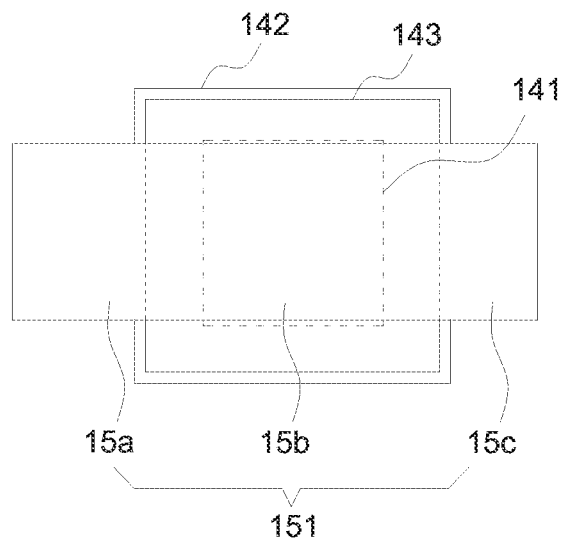

FIG. 3 is a schematic top view of structures of a second electrode and a photosensitive diode in the driving substrate provided by the first embodiment of the present disclosure.

Figure 4:
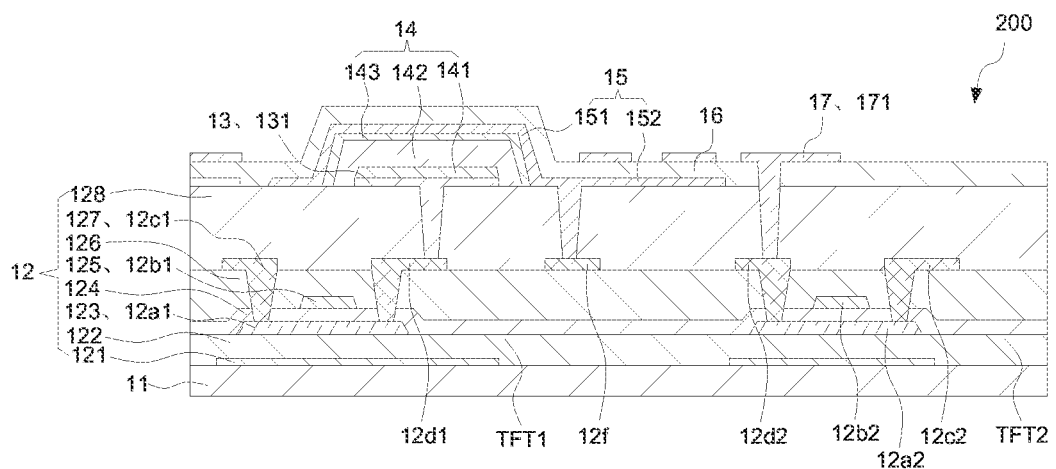

FIG. 4 is a schematic structural diagram of a driving substrate provided by a second embodiment of the present disclosure.

Figure 5:
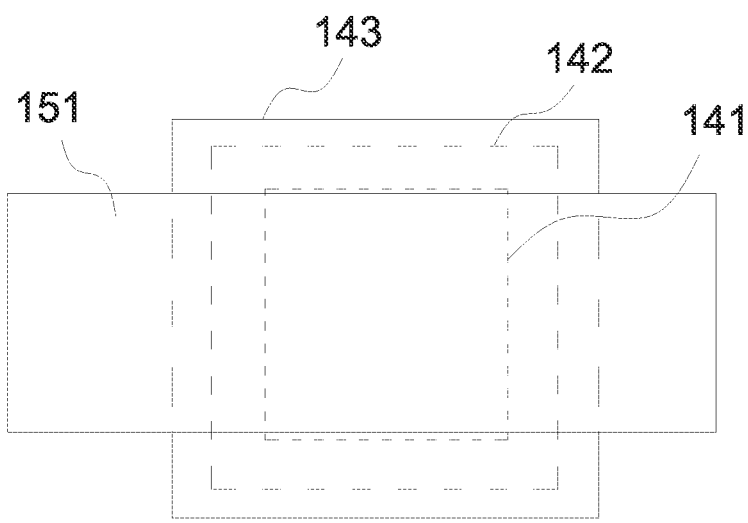

FIG. 5 is a schematic top view of structures of a second electrode and a photosensitive diode in the driving substrate provided by the second embodiment of the present disclosure.

Figure 6:
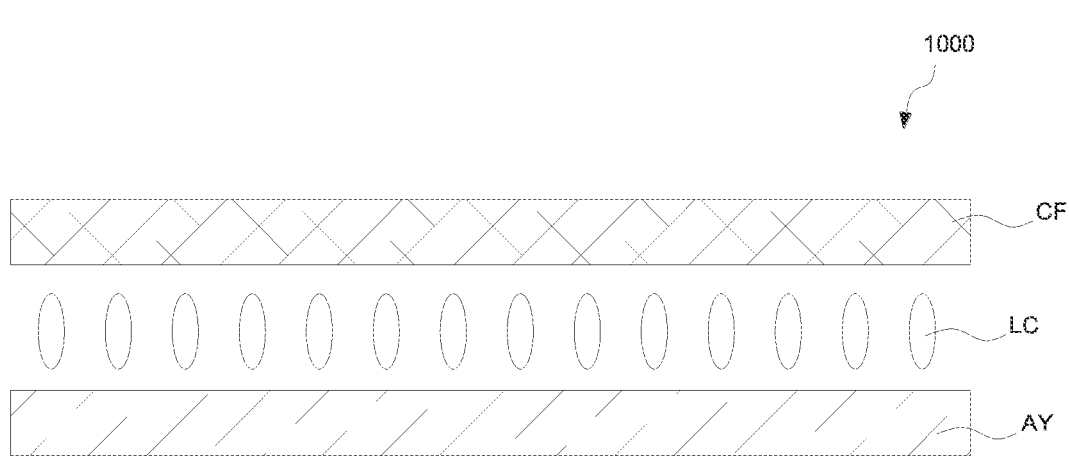

FIG. 6 is a schematic structural diagram of a display panel provided by an embodiment of the present disclosure.

Figure 7:
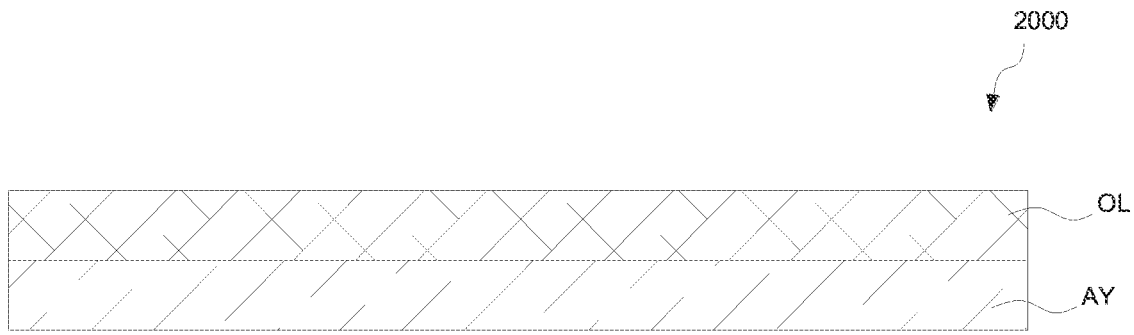

FIG. 7 is another schematic structural diagram of the display panel provided by an embodiment of the present disclosure.

Figure 8:
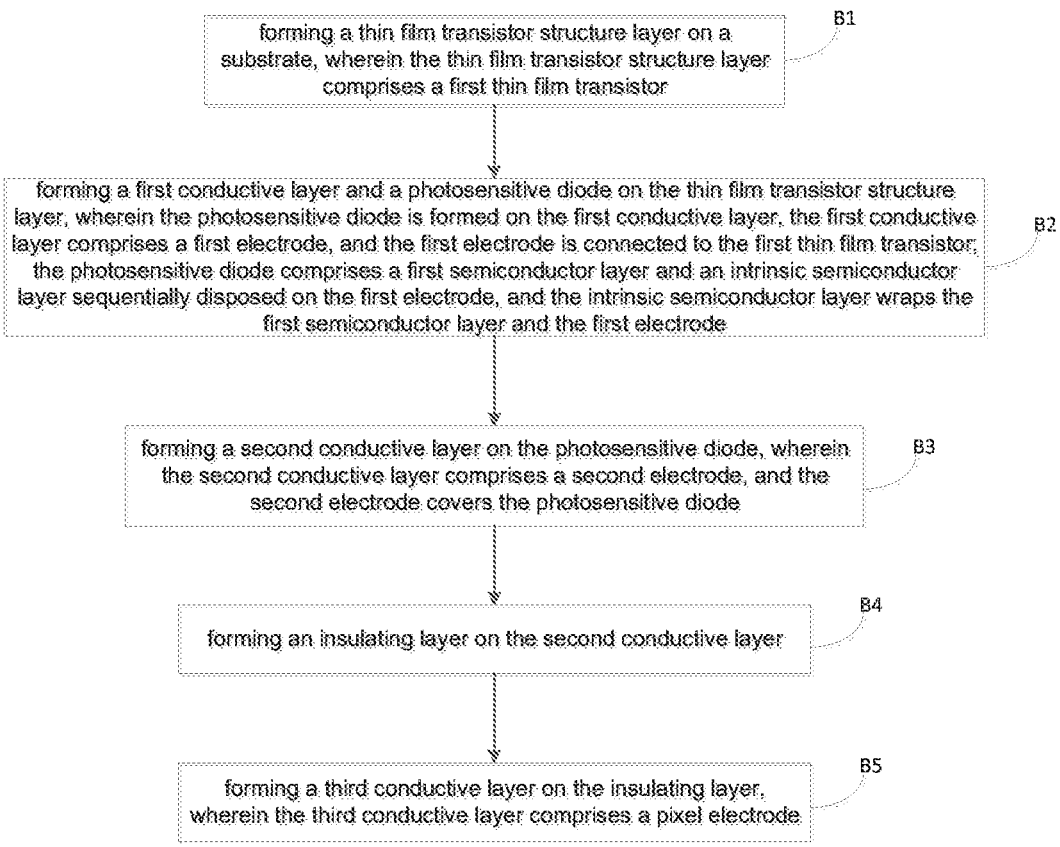

FIG. 8 is a flowchart of a manufacturing method of a driving substrate provided by an embodiment of the present disclosure.

Figure 9:
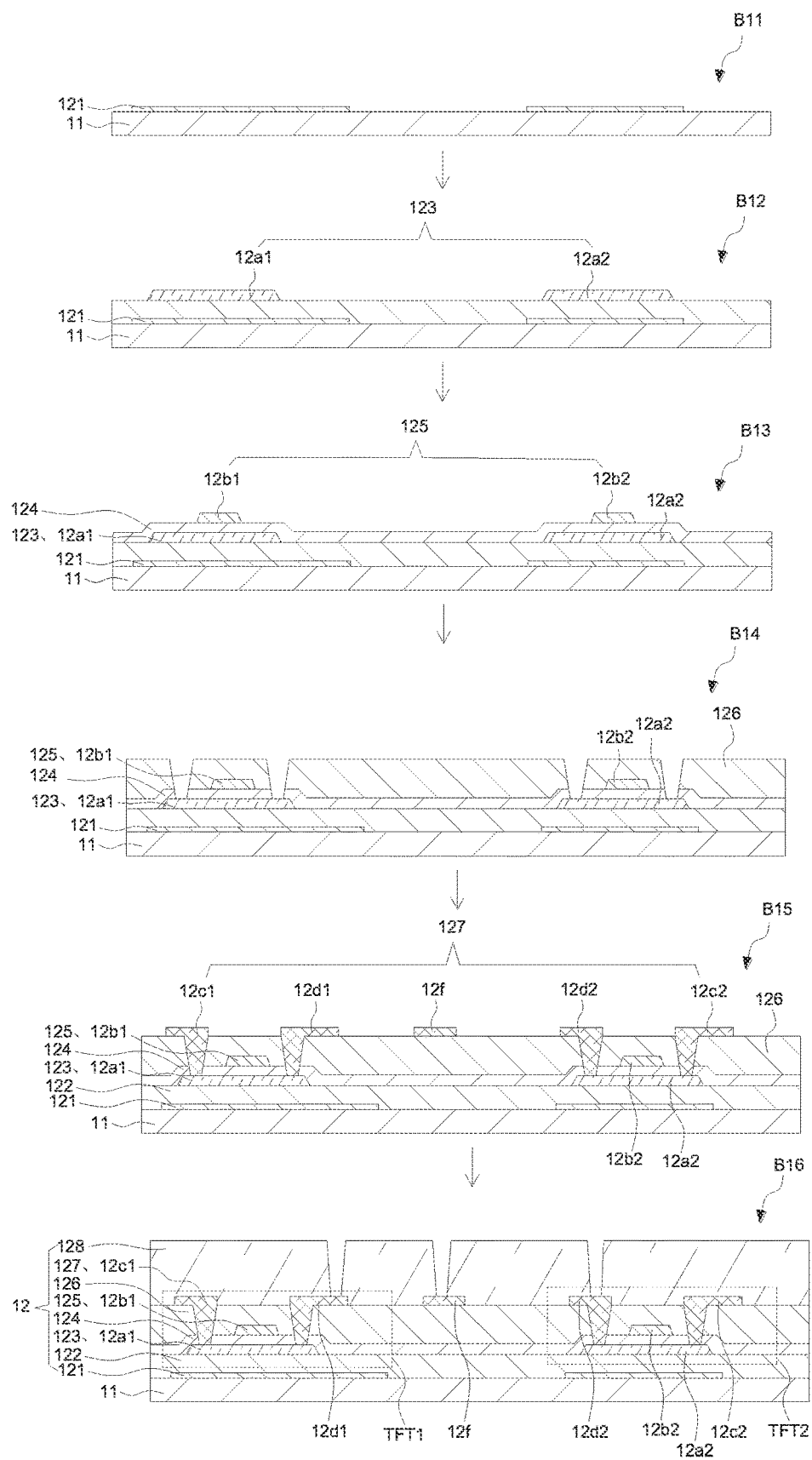

FIG. 9 is a schematic diagram of step B1 in the manufacturing method of the driving substrate provided by the embodiment of the present disclosure.

Figure 10:
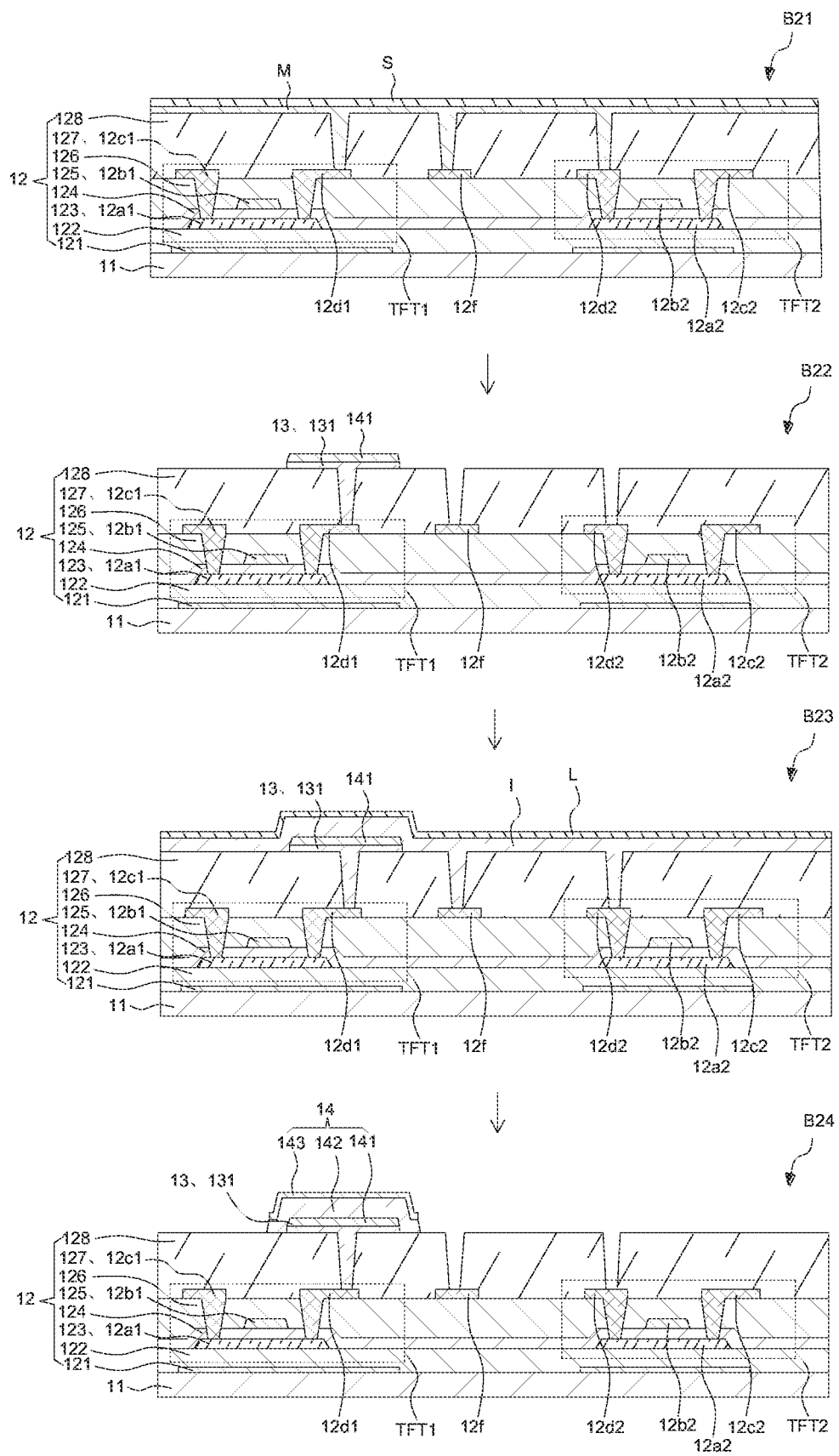

FIG. 10 is a schematic diagram of step B2 in the manufacturing method of the driving substrate provided by the embodiment of the present disclosure.

Figure 11:
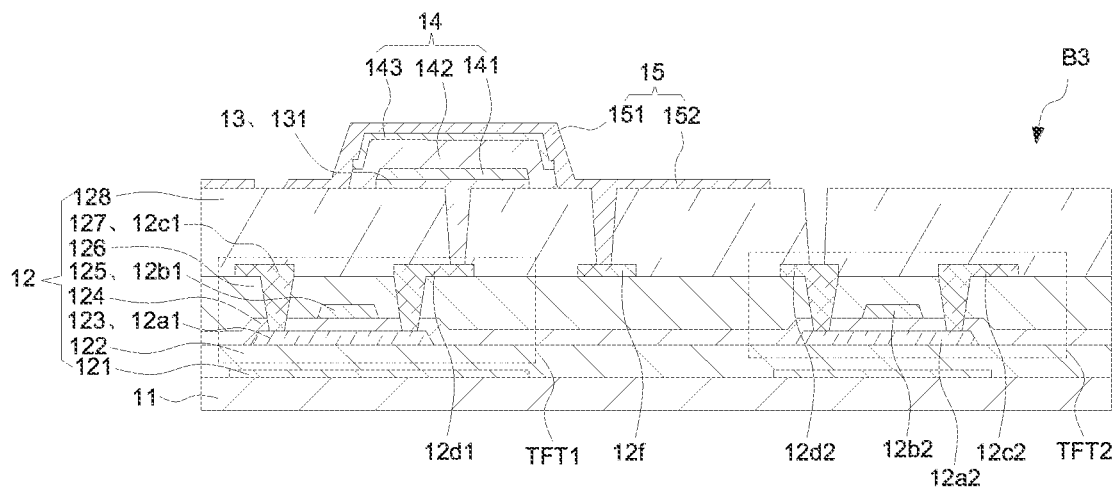

FIG. 11 is a schematic diagram of step B3 in the manufacturing method of the driving substrate provided by the embodiment of the present disclosure.

Figure 12:
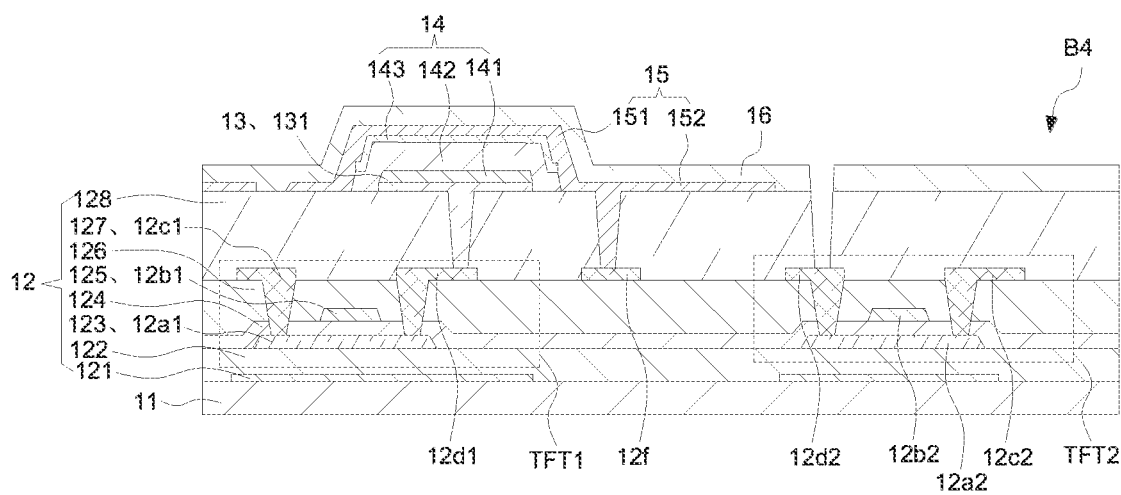

FIG. 12 is a schematic diagram of step B4 in the manufacturing method of the driving substrate provided by the embodiment of the present disclosure.

Figure 13:
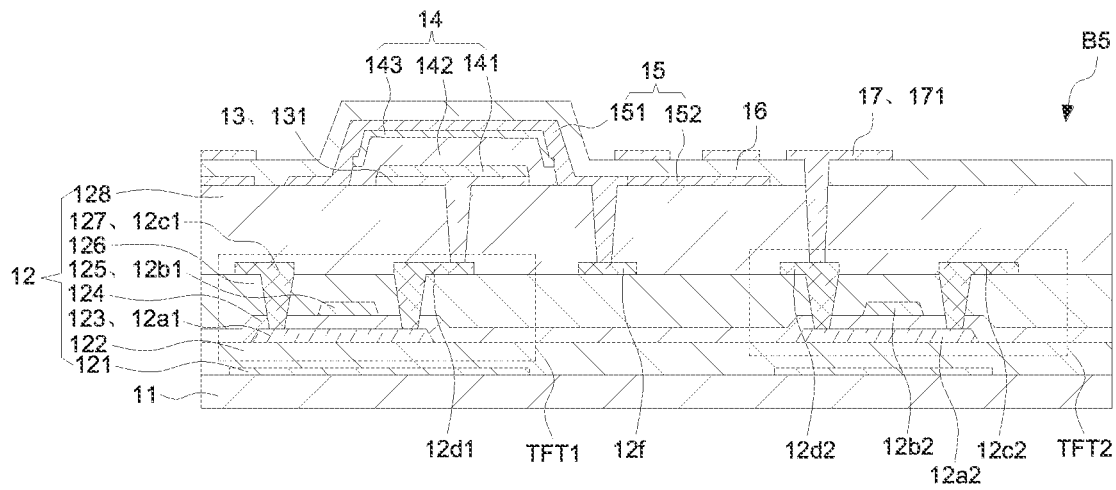

FIG. 13 is a schematic diagram of step B5 in the manufacturing method of the driving substrate provided by the embodiment of the present disclosure.

EMBODIMENTS OF INVENTION

Detailed Description of Preferred Embodiments

Technical solutions in embodiments of the present disclosure will be clearly and completely described below in conjunction with drawings in the embodiments of the present disclosure. Obviously, the described embodiments are only a part of embodiments of the present disclosure, rather than all the embodiments. Based on the embodiments in the present disclosure, all other embodiments obtained by those skilled in the art without creative work fall within the protection scope of the present disclosure. In addition, it should be understood that specific embodiments described herein are only used to illustrate and explain the present disclosure and are not used to limit the present disclosure. In the present disclosure, without any explanation to the contrary, orientation words used such as "up" and "down" generally refer to the up and down in actual use or working state of a device, specifically a drawing surface direction in the drawings; while "inside" and "outside" refer to an outline of the device.

Embodiments of the present disclosure provide a driving substrate, a display panel, and a manufacturing method of a driving substrate, which will be described in detail below. It should be noted that a description order of the following embodiments is not intended to limit a preferred order of the embodiments.

Please refer to FIGS. 2 and 3. FIG. 2 is a schematic structural diagram of a driving substrate provided by a first embodiment of the present disclosure, and FIG. 3 is a schematic top view of structures of a second electrode and a photosensitive diode in the driving substrate provided by the first embodiment of the present disclosure. The first embodiment of the present disclosure provides a driving substrate 100, which comprises a substrate 11, a thin film transistor structure layer 12, a first conductive layer 13, a photosensitive diode 14, a second conductive layer 15, an insulating layer 16, and a third conductive layer 17.

The thin film transistor structure layer 12 is disposed on the substrate 11. The thin film transistor structure layer 12 comprises a first thin film transistor TFT1 and a second thin film transistor TFT2. Wherein, the first thin film transistor TFT1 may be a top-gate thin film transistor or a bottom-gate thin film transistor; and the second thin film transistor TFT2 may be a top-gate thin film transistor or a bottom-gate thin film transistor. The first thin film transistor TFT1 may be a P-type thin film transistor or an N-type thin film transistor; and the second thin film transistor TFT2 may be a P-type thin film transistor or an N-type thin film transistor. In the first embodiment, as an example, the first thin film transistor TFT1 and the second thin film transistor TFT2 are both N-type top-gate thin film transistors, but are not limited to this.

The first conductive layer 13 is disposed on the thin film transistor structure layer 12. The first conductive layer 13 comprises a first electrode 131. The first electrode 131 is connected to the first thin film transistor TFT1.

The photosensitive diode 14 is disposed on the first electrode 131. The photosensitive diode 14 comprises a first semiconductor layer 141, an intrinsic semiconductor layer 142, and a second semiconductor layer 143 sequentially disposed on the first electrode 131. The intrinsic semiconductor layer 142 wraps the first semiconductor layer 141 and the first electrode 131. The second semiconductor layer 143 covers the intrinsic semiconductor layer 142.

In the first embodiment, as an example, the first semiconductor layer 141 is an N-type semiconductor layer and the second semiconductor layer 143 is a P-type semiconductor layer, but are not limited to this. For example, the first semiconductor layer 141 may also be a P-type semiconductor layer, and the second semiconductor layer 143 is an N-type semiconductor layer.

The second conductive layer 15 is disposed on the photosensitive diode 14. The second conductive layer 15 comprises a second electrode 151 and a common electrode 152. The second electrode 151 covers the photosensitive diode 14. Specifically, the second electrode 151 covers the second semiconductor layer 143. The second electrode 151 is connected to the second semiconductor layer 143 and the intrinsic semiconductor layer 142.

It should be noted that since the intrinsic semiconductor layer 142 and the second semiconductor layer are formed by a same photomask, one photomask is reduced and the manufacturing process is simplified. In addition, since the intrinsic semiconductor layer 142 and the second semiconductor layer are formed by the same photomask, when the second electrode 151 is formed on the second semiconductor layer 143, the second electrode 151 is connected to the second semiconductor layer 143 and the intrinsic semiconductor layer 142.

The common electrode 152 is connected to the second electrode 151. The common electrode 152 is disposed on the thin film transistor structure layer 12. The second electrode 151 and the common electrode 152 are formed by a same process, which can thin the structure and save space.

The insulating layer 16 and the third conductive layer 17 are sequentially disposed on the second conductive layer 15.

The third conductive layer 17 comprises a pixel electrode 171. The pixel electrode 171 is connected to the second thin film transistor TFT2.

In the driving substrate 100 of the first embodiment, the first electrode 131 and the first semiconductor layer 141 are formed in a same process, thereby saving an insulating layer; and the intrinsic semiconductor layer 142 wraps the first semiconductor layer 141 and the first electrode 131, thereby preventing short circuiting due to connection between the second semiconductor layer and the first semiconductor and at the same time saving an insulating layer.

In some embodiments, the photosensitive diode 14 may also omit the second semiconductor layer 143. That is, the photosensitive diode 14 comprises the first semiconductor layer 141 and the intrinsic semiconductor layer 142, and the intrinsic semiconductor layer 142 wraps the first semiconductor layer 141. At this time, the second electrode 151 covers the intrinsic semiconductor layer 142 and is connected to the intrinsic semiconductor layer 142.

In the driving substrate 100 of the first embodiment, the substrate 11 may be a glass substrate or a flexible substrate. Materials of the substrate 11 comprise one of glass, silicon dioxide, polyethylene, polypropylene, polystyrene, polylactic acid, polyethylene terephthalate, polyimide, or polyurethane.

The first conductive layer 13 may be a single-layer structure or a multi-layer structure, and may be, for example, one of Ti (titanium) layer/Al (aluminum) layer/Ti (titanium) layer, Mo (molybdenum) layer, Mo (molybdenum)/Cu (copper) layer, or Mo (molybdenum) layer/Al (aluminum) layer/Mo (molybdenum) layer.

Wherein, part of the photosensitive diode 14 overlaps the first electrode 131 to improve sensitivity of a photosensitive sensor.

Alternatively, a material of the first semiconductor layer 141 in the photosensitive diode 14 is N-type amorphous silicon; a material of the intrinsic semiconductor layer 142 is amorphous silicon; and a material of the second semiconductor layer 143 is P-type amorphous silicon.

Materials of the second conductive layer 15 comprise but are not limited to, indium tin oxide. The second electrode 151 and the photosensitive diode 14 are overlapped.

Alternatively, please refer to FIG. 3. In an extending direction of the second electrode 151, the second electrode 151 comprises a first portion 15a, a second portion 15b, and a third portion 15c that are connected in sequence. The first portion 15a is electrically connected to a common wire 12f. The first portion 15a and the third portion 15c are disposed outside the second semiconductor layer 143, and the second portion 15b overlaps the second semiconductor layer 143, i.e., both the first portion 15a and the third portion 15c extend beyond the second semiconductor layer 143, thereby improving stability and uniformity of transmission of electrical signals.

Alternatively, a length of the third portion 5c is less than 2.5 μm.

In an extending direction perpendicular to the second electrode 151, a boundary of the second portion 15b is arranged within an outer contour line of the second semiconductor 143 to improve light transmittance and save space.

Alternatively, in some embodiments, the second electrode 151 covers or exceeds the entire second semiconductor layer 143 in the extending direction perpendicular to the second electrode 151 to improve stability of connection and signal transmission.

Alternatively, the second portion 15b covers more than 63% of an area of the second semiconductor 143 to ensure connectivity and photoelectric performance of the photosensitive diode 14. For example, the second portion 15b may cover 63%, 64%, 70%, 75%, 80%, 85%, 90% or 100% of the area of the second semiconductor 143.

In the driving substrate 100 in the first embodiment, the thin film transistor structure layer 12 comprises a light shielding layer 121, a buffer layer 122, an active layer 123, an insulating layer 124, a first metal layer 125, an interlayer dielectric layer 126, a second metal layer 127, and a planarization layer 128 that are disposed on the substrate 11 sequentially.

The active layer 123 comprises a first active portion 12a1 and a second active portion 12a2. Materials of the active layer 123 may be polysilicon or metal oxide. The first metal layer 125 comprises a first gate 12b1 and a second gate 12b2. The second metal layer 127 comprises a first source 12c1, a first drain 12d1, a second source 12c2, a second drain 12d2, and the common wire 12f.

The first active portion 12a1, the first gate 12b1, the first source 12c1, and the first drain 12d1 form the first thin film transistor TFT1. The second active portion 12a2, the second gate 12b2, the second source 12c2, and the second drain 12d2 form the second thin film transistor TFT2.

The first source 12c1 or the first drain 12d1 is electrically connected to the first electrode 131. The second source 12c2 or the second drain 12d2 is electrically connected to the pixel electrode 171.

In the driving substrate 100 of the first embodiment, the first drain 12d1 is electrically connected to the first electrode 131. The second drain 12d2 is electrically connected to the pixel electrode 171.

Wherein, the common wire 12f is connected to the second electrode 151 and the common electrode 152, and the common electrode 152 may be multiplexed as a touch electrode. That is, the second electrode 151 and the common electrode 152 are connected through a same common wire 12f to realize wiring multiplexing and save space.

It should be noted that when the driving substrate 100 of this embodiment is in a touch stage, the common wire 12f is connected to a touch signal; and when the driving substrate 100 of this embodiment is in a sensing stage, the common wire 12f is connected to a sensing signal.

In addition, the photosensitive diode 14 and the first thin film transistor TFT1 are at least partially overlapped to increase aperture ratio.

In the first embodiment, the light shielding layer 121 is overlapped with the first active portion 12a1 and also overlapped with the photosensitive diode 14 to prevent light from irradiating the first active portion 12a1 and the photosensitive diode 14.

Alternatively, materials of the light shielding layer 121 may be metal materials. Materials of the buffer layer 122 comprise, but are not limited to, silicon nitride or silicon oxide. Materials of the insulating layer 124 may comprise at least one of silicon nitride, silicon oxide, or organic photoresist. Materials of the first metal layer 125 may comprise at least one of copper, aluminum, or titanium. Materials of the interlayer dielectric layer 126 may comprise at least one of silicon nitride, silicon oxide, or organic photoresist. Materials of the planarization layer 128 may comprise at least one of silicon nitride, silicon oxide, or organic photoresist.

Please refer to FIGS. 4 and 5. FIG. 4 is a schematic structural diagram of a driving substrate provided by a second embodiment of the present disclosure, and FIG. 5 is a schematic top view of structures of a second electrode and a photosensitive diode in the driving substrate provided by the second embodiment of the present disclosure.

A driving substrate 200 of the second embodiment comprises the substrate 11, the thin film transistor structure layer 12, the first conductive layer 13, the photosensitive diode 14, the second conductive layer 15, the insulating layer 16, and the third conductive layer 17 disposed sequentially.

The photosensitive diode 14 comprises the first semiconductor layer 141, the intrinsic semiconductor layer 142, and the second semiconductor layer 143 sequentially disposed on the first electrode 131.

Difference between the driving substrate 200 of the second embodiment and the driving substrate 100 of the first embodiment is that the second semiconductor layer 143 wraps the intrinsic semiconductor layer 142. The second electrode 151 is connected to the second semiconductor layer 143.

In the driving substrate 200 of the second embodiment, the second semiconductor layer 143 wraps the intrinsic semiconductor layer 142 to improve sensitivity of fingerprint recognition.

The structure of the driving substrate 200 of the second embodiment is similar or same as the structure of the driving substrate 100 of the first embodiment. For details, please refer to contents of the driving substrate 100 of the first embodiment, which will not be repeated here.

Please refer to FIG. 6, which is a schematic structural diagram of a display panel provided by an embodiment of the present disclosure. The display panel 1000 of this embodiment comprises a color film substrate CF, a driving substrate AY, and a liquid crystal LC disposed between the color film substrate CF and the driving substrate AY. Wherein, the driving substrate AY is the driving substrate 100 of the first embodiment, the driving substrate 200 of the second embodiment, or driving substrates of other embodiments described above.

Please refer to FIG. 7, which is a schematic diagram of another structure of a display panel provided by an embodiment of the present disclosure. This embodiment also provides a display panel 2000, which comprises a driving substrate AY and an organic light-emitting element layer OL disposed on the driving substrate AY. The driving substrate AY is the driving substrate 100 of the first embodiment, the driving substrate 200 of the second embodiment, or the driving substrates of other embodiments described above.

Correspondingly, please refer to FIG. 8, which is a flowchart of a manufacturing method of a driving substrate provided by an embodiment of the present disclosure. The embodiment of the present disclosure further provides a manufacturing method of a driving substrate, which comprises the following steps:

Step B1: forming a thin film transistor structure layer on a substrate, wherein the thin film transistor structure layer comprises a first thin film transistor;

Step B2: forming a first conductive layer and a photosensitive diode on the thin film transistor structure layer, wherein the photosensitive diode is formed on the first conductive layer, and the first conductive layer comprises a first electrode connected to the first thin film transistor; the photosensitive diode comprises a first semiconductor layer and an intrinsic semiconductor layer sequentially disposed on the first electrode, and the intrinsic semiconductor layer wraps the first semiconductor layer and the first electrode.

Step B3: forming a second conductive layer on the photosensitive diode, wherein the second conductive layer comprises a second electrode covering the photosensitive diode;

Step B4: forming an insulating layer on the second conductive layer;

Step B5: forming a third conductive layer on the insulating layer, wherein the third conductive layer comprises a pixel electrode.

In the manufacturing method of the embodiment of the present disclosure, the first electrode and the first semiconductor layer are formed by a same photomask, and the intrinsic semiconductor layer wraps the first semiconductor layer and the first electrode, thereby omitting the first insulating layer and the second insulating layer in prior art, simplifying the structure of the driving substrate and reducing process difficulty of the manufacturing method of the driving substrate.

The manufacturing method of this embodiment takes the first semiconductor layer 141 being an N-type semiconductor layer and the second semiconductor layer 143 being a P-type semiconductor layer as an example, but is not limited to this. For example, the first semiconductor layer 141 may also be a P-type semiconductor layer and the second semiconductor layer 143 an N-type semiconductor layer.

The manufacturing method of the above-mentioned driving substrate will be described below.

Please refer to FIG. 9. Step B1: forming the thin film transistor structure layer 12 on the substrate 11. The thin film transistor structure layer 12 comprises the first thin film transistor TFT1 and the second thin film transistor TFT2.

Alternatively, the substrate 11 may be a glass substrate or a flexible substrate. Materials of the substrate 11 comprises one of glass, silicon dioxide, polyethylene, polypropylene, polystyrene, polylactic acid, polyethylene terephthalate, polyimide, or polyurethane.

The first thin film transistor TFT1 may be a top-gate thin film transistor or a bottom-gate thin film transistor; and the second thin film transistor TFT2 may be a top-gate thin film transistor or a bottom-gate thin film transistor. The first thin film transistor TFT1 may be a P-type thin film transistor or an N-type thin film transistor, and the second thin film transistor TFT2 may be a P-type thin film transistor or an N-type thin film transistor. In the first embodiment, the first thin film transistor TFT1 and the second thin film transistor TFT2 are both N-type top-gate thin film transistors as an example, but are not limited to this.

Specifically, step B1 comprises the following steps:

Step B1 comprises the following steps:

Step B11: forming the light shielding layer 121 on the substrate 11. Wherein, the light shielding layer 121 is configured to shield the photosensitive diode 14 in subsequent processes and the first thin film transistor TFT1. Alternatively, a metal material layer is formed on the substrate 11 first, and then the metal material layer is patterned by a photolithography process to form the light-shielding layer 121. Then, proceed to step B12.

Step B12: forming the buffer layer 122 and the active layer 123 on the light shielding layer 121 in sequence. The active layer 123 comprises the first active portion 12a1 and the second active portion 12a2. The first active portion 12a1 and the light shielding layer 121 are overlapped.

The materials of the buffer layer 122 comprise, but not limited to, silicon nitride or silicon oxide. The materials of the active layer 123 may be polysilicon or metal oxide. The manufacturing method of this embodiment is described by taking the active layer 123 being polysilicon as an example, but is not limited to this.

Alternatively, the buffer layer 122 and an amorphous silicon layer are sequentially formed on the light shielding layer 121, and then the amorphous silicon layer is subjected to an excimer laser annealing treatment to transform the amorphous silicon layer into a polysilicon layer; then, the polysilicon layer is patterned by a photolithography process; then, the polysilicon layer is doped with phosphorous ions to form an N+ doped region, i.e., a heavily doped region; finally, use the first gate 12b1 and the second gate 12b2 in subsequent processes as photomasks, the polysilicon layer is performed with an N-ion implantation to form a lightly doped region.

Step B13: forming the insulating layer 124 and the first metal layer 125 sequentially on the active layer 123. The first metal layer 125 comprises a first gate 12b1 and a second gate 12b2.

Alternatively, the materials of the insulating layer 124 may comprise at least one of silicon nitride, silicon oxide, or organic photoresist. The materials of the first metal layer 125 may comprise at least one of copper, aluminum, or titanium.

Alternatively, first, the insulating layer 124 and the first metal material layer are formed on the substrate 11, both of which cover the above-mentioned patterned polysilicon layer and the substrate 11. Then, the first metal material layer is patterned by a photolithography process to form the first metal layer 125. Then, the polysilicon layer is lightly doped, and then proceed to step B14.

Step B14: forming the interlayer dielectric layer 126 on the first metal layer 125. The materials of the interlayer dielectric layer 126 may comprise at least one of silicon nitride, silicon oxide, or organic photoresist.

Alternatively, an organic layer is formed on the first metal layer 125, and then the organic layer is patterned by exposure and etching to form the interlayer dielectric layer 126. Then, proceed to step B15.

Step B15: forming the second metal layer 127 on the interlayer dielectric layer 126. The second metal layer 127 comprises the first source 12c1, the first drain 12d1, the second source 12c2, the second drain 12d2, and the common wire 12f. The first active portion 12a1, the first gate 12b1, the first source 12c1, and the first drain 12d1 form the first thin film transistor TFT1. The second active portion 12a2, the second gate 12b2, the second source 12c2, and the second drain 12d2 form the second thin film transistor TFT2.

The first source 12c1 or the first drain 12d1 is electrically connected to the first electrode 131. The second source 12c2 or the second drain 12d2 is electrically connected to the pixel electrode 171. In the manufacturing method of the driving substrate of this embodiment, the first drain electrode 12d1 is electrically connected to the first electrode 131. The second drain electrode 12d2 is electrically connected to the pixel electrode 171.

Wherein, the common wire 12f is connected to the second electrode 151 and the common electrode 152, and the common electrode 152 is multiplexed as a touch electrode. That is, the second electrode 151 and the common electrode 152 are connected through the same common wire 12f to achieve wiring multiplexing and space saving.

In addition, the photosensitive diode 14 and the first thin film transistor TFT1 are at least partially overlapped to increase the aperture ratio.

Alternatively, materials of the second metal layer 127 and the materials of the first metal layer 125 are same or different.

Alternatively, a second metal material layer is formed on the interlayer dielectric layer 126, and then the second metal material layer is patterned by a photolithography process to form the second metal layer 127. Then, proceed to step B16.

Step B16: forming the planarization layer 128 on the second metal layer 127. The materials of the planarization layer 128 may comprise at least one of silicon nitride, silicon oxide, or organic photoresist.

Alternatively, an organic layer is formed on the second metal layer 127, and then the organic layer is patterned by exposure and etching to form the planarization layer 128. Then proceed to step B2.

Step B2: forming the first conductive layer 13 and the photosensitive diode 14 on the thin film transistor structure layer 12. The photosensitive diode 14 is formed on the first conductive layer 13. The first conductive layer 13 comprises the first electrode 131. The first electrode 131 is connected to the first thin film transistor TFT1. The photosensitive diode 14 comprises the first semiconductor layer 141 and the intrinsic semiconductor layer 142 sequentially disposed on the first electrode 131. The intrinsic semiconductor layer 142 wraps the first semiconductor layer 141 and the first electrode 131.

In this embodiment, referring to FIG. 10, step B2 comprises the following steps:

Step B21: forming a first conductive material layer M and a first semiconductor material layer S on the thin film transistor structure layer 12 in sequence.

The first conductive material layer M may have a single-layer structure or a multi-layer structure, such as one of Ti layer/Al layer/Ti layer, Mo layer, Mo layer/Cu layer, or Mo layer/Al layer/Mo layer. A material of the first semiconductor material layer S may be N-type amorphous silicon.

Step B22: patterning the first conductive material layer M and the first semiconductor material layer S by a same photomask to form the first conductive layer 13 and the first semiconductor layer 141.

Step B23: forming an intrinsic semiconductor material layer I and a second semiconductor material layer L sequentially on the first semiconductor layer 141.

A material of the intrinsic semiconductor material layer I is amorphous silicon. A material of the second semiconductor material layer L is P-type amorphous silicon.

In some embodiments, step B23 can further omit the second semiconductor material layer L, and there is no second semiconductor layer 143 in the subsequent step B24.

Step B24: patterning the intrinsic semiconductor material layer I and the second semiconductor material layer L with a same photomask to form the intrinsic semiconductor layer 142 and the second semiconductor layer 143.

A same photomask is used to pattern the intrinsic semiconductor material layer I and the second semiconductor material layer L at the same time, which saves a photomask and improves the process efficiency. Then, proceed to step B3.

In some embodiments, step B2 may further comprise the following steps:

Step B201: forming a first conductive material layer M and a first semiconductor material layer S on the thin film transistor structure layer 12 in sequence.

Step B202: patterning the first conductive material layer M and the first semiconductor material layer S with a same photomask to form the first conductive layer 13 and the first semiconductor layer 141.

Step B203: forming the intrinsic semiconductor layer 142 on the first semiconductor layer 141. The intrinsic semiconductor layer 142 wraps the first semiconductor layer 141.

Step B204: forming the second semiconductor layer 143 on the intrinsic semiconductor layer 142. The second semiconductor layer 143 wraps the intrinsic semiconductor layer 142; please refer to FIG. 4. Sensitivity of the photosensitive diode 14 can be improved by wrapping the intrinsic semiconductor layer 142 with the second semiconductor layer 143.

Referring to FIG. 11, step B3: forming the second conductive layer 15 on the photosensitive diode 14. The second conductive layer 15 comprises the second electrode 151 and the common electrode 152. The second electrode 151 covers the photosensitive diode 14. The common electrode 152 is connected to the second electrode 151. The second electrode 151 and the common electrode 152 are commonly connected to the common wire 12f to achieve wiring multiplexing and space saving.

The material of the second conductive layer 15 comprises, but is not limited to, indium tin oxide.

Then, proceed to step B4.

Referring to FIG. 12, step B4: forming the insulating layer 16 on the second conductive layer 15. The materials of the insulating layer 16 may comprise silicon nitride and/or silicon oxide. Then, proceed to step B5.

Referring to FIG. 13, step B5: forming the third conductive layer 17 on the insulating layer 16. The third conductive layer 17 comprises the pixel electrode 171. The pixel electrode 171 is electrically connected to the second drain electrode 12d2.

Materials of the third conductive layer 17 comprise but are not limited to, indium tin oxide.

As such, the manufacturing process of the driving substrate of this embodiment is completed.

The embodiments of the present disclosure save the first insulating layer and the second insulating layer in the prior art, thereby simplifying the structure of the driving substrate and reducing the process difficulty of the manufacturing method of the driving substrate.

The above describes in detail the driving substrate, the display panel and the manufacturing method of the driving substrate provided by the embodiments of the present disclosure. In this article, specific examples are applied to describe the principle and implementation mode of the present disclosure. The description of the above embodiments is only used to help understand the method and the core idea of the present disclosure. At the same time, for those skilled in the art, according to the idea of the present disclosure, there will be some changes in the specific implementation mode and application scope of the present disclosure. To sum up, the content of this specification should not be understood as a restriction on the present disclosure.

What is claimed is:
1. A driving substrate, comprising:
   a substrate;
   a thin film transistor structure layer disposed on the substrate, wherein the thin film transistor structure layer comprises a first thin film transistor;
   a first conductive layer disposed on the thin film transistor structure layer, wherein the first conductive layer comprises a first electrode, and the first electrode is connected to the first thin film transistor;

a photosensitive diode disposed on the first electrode, wherein the photosensitive diode comprises a first semiconductor layer and an intrinsic semiconductor layer sequentially disposed on the first electrode, and the intrinsic semiconductor layer wraps the first semiconductor layer and the first electrode; and a second conductive layer disposed on the photosensitive diode, wherein the second conductive layer comprises a second electrode, and the second electrode covers the photosensitive diode, wherein the second conductive layer further comprises a common electrode, and the common electrode is connected to the second electrode, wherein the thin film transistor structure layer comprises a buffer layer, an active layer, an insulating layer, a first metal layer, an interlayer dielectric layer, a second metal layer, and a planarization layer which are sequentially disposed on the substrate;

the first metal layer comprises a first gate, and the active layer comprises a first active portion, and the second metal layer comprises a first source, a first drain, and a common wire; and the first gate, the first active portion, the first source, and the first drain form the first thin film transistor; the first source or the first drain is electrically connected to the first electrode, and the common wire is connected to the second electrode and the common electrode.

2. The driving substrate of claim 1, wherein the photosensitive diode further comprises a second semiconductor layer disposed on the intrinsic semiconductor layer, the second semiconductor layer wraps the intrinsic semiconductor layer, and the second electrode is connected to the second semiconductor layer.

3. The driving substrate of claim 1, wherein the photosensitive diode further comprises a second semiconductor layer disposed on the intrinsic semiconductor layer, the second semiconductor layer covers the intrinsic semiconductor layer, and the second electrode is connected to the second semiconductor layer and the intrinsic semiconductor layer.

4. The driving substrate of claim 2, wherein in an extending direction of the second electrode, the second electrode comprises a first portion, a second portion, and a third portion that are sequentially connected, wherein the first portion and the third portion are disposed outside the second semiconductor layer, and the second portion and the second semiconductor layer are overlapped.

5. The driving substrate of claim 4, wherein a boundary of the second portion is disposed within an outer contour line of the second semiconductor in a direction perpendicular to the extending direction of the second electrode.

6. The driving substrate of claim 4, wherein the second portion covers at least 63% of an area of the second semiconductor layer.

7. The driving substrate of claim 1, wherein the photosensitive diode and the first thin film transistor are at least partially overlapped.

8. The driving substrate of claim 1, wherein the common electrode is multiplexed as a touch electrode.

9. The driving substrate of claim 1, wherein the thin film transistor structure layer further comprises a light shielding layer disposed between the substrate and the buffer layer, and the light shielding layer is overlapped with the first active portion and also the photosensitive diode.

10. The driving substrate of claim 1, wherein the driving substrate further comprises an insulating layer and a third conductive layer sequentially disposed on the second conductive layer, and the third conductive layer comprises a pixel electrode;

the first metal layer further comprises a second gate, the active layer comprises a second active portion, and the second metal layer comprises a second source and a second drain, wherein the second gate, the second active portion, the second source, and the second drain form a second thin film transistor; and the second source electrode or the second drain electrode is electrically connected to the pixel electrode.

11. A display panel, wherein the display panel comprises a color film substrate, a driving substrate, and liquid crystal disposed between the color film substrate and the driving substrate, and the driving substrate comprises:

a substrate;

a thin film transistor structure layer disposed on the substrate, wherein the thin film transistor structure layer comprises a first thin film transistor;

a first conductive layer disposed on the thin film transistor structure layer, wherein the first conductive layer comprises a first electrode, and the first electrode is connected to the first thin film transistor;

a photosensitive diode disposed on the first electrode, wherein the photosensitive diode comprises a first semiconductor layer and an intrinsic semiconductor layer sequentially disposed on the first electrode, and the intrinsic semiconductor layer wraps the first semiconductor layer and the first electrode; and a second conductive layer disposed on the photosensitive diode, wherein the second conductive layer comprises a second electrode, and the second electrode covers the photosensitive diode, wherein the second conductive layer further comprises a common electrode, and the common electrode is connected to the second electrode, wherein the thin film transistor structure layer comprises a buffer layer, an active layer, an insulating layer, a first metal layer, an interlayer dielectric layer, a second metal layer, and a planarization layer which are sequentially disposed on the substrate;

the first metal layer comprises a first gate, and the active layer comprises a first active portion, and the second metal layer comprises a first source, a first drain, and a common wire; and the first gate, the first active portion, the first source, and the first drain form the first thin film transistor; the first source or the first drain is electrically connected to the first electrode, and the common wire is connected to the second electrode and the common electrode.

12. The display panel of claim 11, wherein the photosensitive diode further comprises a second semiconductor layer disposed on the intrinsic semiconductor layer, the second semiconductor layer wraps the intrinsic semiconductor layer, and the second electrode is connected to the second semiconductor layer.

13. The display panel of claim 11, wherein the photosensitive diode further comprises a second semiconductor layer disposed on the intrinsic semiconductor layer, the second semiconductor layer covers the intrinsic semiconductor layer, and the second electrode is connected to the second semiconductor layer and the intrinsic semiconductor layer.

14. The display panel of claim 12, wherein, in an extending direction of the second electrode, the second electrode comprises a first portion, a second portion, and a third portion that are sequentially connected; the first portion and the third portion are disposed outside the second semiconductor layer; and the second portion and the second semiconductor layer are overlapped.

15. The display panel of claim 14, wherein a boundary of the second portion is disposed within an outer contour line of the second semiconductor in a direction perpendicular to the extending direction of the second electrode.

16. A manufacturing method of a driving substrate, wherein the manufacturing method comprises following steps:
   Step B1: forming a thin film transistor structure layer on a substrate, wherein the thin film transistor structure layer comprises a first thin film transistor;
   Step B2: forming a first conductive layer and a photosensitive diode on the thin film transistor structure layer, wherein the photosensitive diode is formed on the first conductive layer, the first conductive layer comprises a first electrode, and the first electrode is connected to the first thin film transistor; the photosensitive diode comprises a first semiconductor layer and an intrinsic semiconductor layer sequentially disposed on the first electrode, and the intrinsic semiconductor layer wraps the first semiconductor layer and the first electrode; and
   Step B3: forming a second conductive layer on the photosensitive diode, wherein the second conductive layer comprises a second electrode, and the second electrode covers the photosensitive diode,
   wherein the second conductive layer further comprises a common electrode, and the common electrode is connected to the second electrode,
   wherein the thin film transistor structure layer comprises a buffer layer, an active layer, an insulating layer, a first metal layer, an interlayer dielectric layer, a second metal layer, and a planarization layer which are sequentially disposed on the substrate;
   the first metal layer comprises a first gate, and the active layer comprises a first active portion, and the second metal layer comprises a first source, a first drain, and a common wire; and
   the first gate, the first active portion, the first source, and the first drain form the first thin film transistor; the first source or the first drain is electrically connected to the first electrode, and the common wire is connected to the second electrode and the common electrode.

17. The manufacturing method of the driving substrate of claim 16, wherein the step B2 further comprises following steps:
   forming a first conductive material layer and a first semiconductor material layer on the thin film transistor structure layer sequentially;
   patterning the first conductive material layer and the first semiconductor material layer with a same photomask to form the first conductive layer and the first semiconductor layer;
   forming the intrinsic semiconductor layer on the first semiconductor layer, wherein the intrinsic semiconductor layer wraps the first semiconductor layer; and
   forming a second semiconductor layer on the intrinsic semiconductor layer, wherein the second semiconductor layer wraps the intrinsic semiconductor layer.

18. The manufacturing method of the driving substrate of claim 16, wherein the step B2 further comprises following steps:
   forming a first conductive material layer and a first semiconductor material layer on the thin film transistor structure layer sequentially;
   patterning the first conductive material layer and the first semiconductor material layer with a same photomask to form the first conductive layer and the first semiconductor layer;
   forming an intrinsic semiconductor material layer and a second semiconductor material layer on the first semiconductor layer sequentially; and
   patterning the intrinsic semiconductor material layer and the second semiconductor material layer with a same photomask to form the intrinsic semiconductor layer and the second semiconductor layer.

* * * * *